US007606373B2

(12) United States Patent
Moorer

(10) Patent No.: US 7,606,373 B2
(45) Date of Patent: Oct. 20, 2009

(54) MULTI-CHANNEL SURROUND SOUND MASTERING AND REPRODUCTION TECHNIQUES THAT PRESERVE SPATIAL HARMONICS IN THREE DIMENSIONS

(76) Inventor: James A. Moorer, 639 Bamboo Ter., San Rafael, CA (US) 94903

( * ) Notice: Subject to any disclaimer, the term of this patent is extended or adjusted under 35 U.S.C. 154(b) by 965 days.

(21) Appl. No.: 11/069,533

(22) Filed: Feb. 25, 2005

(65) Prior Publication Data

US 2005/0141728 A1 Jun. 30, 2005

Related U.S. Application Data

(63) Continuation of application No. 09/552,378, filed on Apr. 19, 2000, now Pat. No. 6,904,152, which is a continuation-in-part of application No. 08/936,636, filed on Sep. 24, 1997, now Pat. No. 6,072,878.

(51) Int. Cl.
*H04R 5/00* (2006.01)
*H03G 3/00* (2006.01)

(52) U.S. Cl. .......................................... 381/18; 381/61

(58) Field of Classification Search ..................... 381/1, 381/17–20, 26, 61, 63, 74, 307, 309, 310, 381/27

See application file for complete search history.

(56) References Cited

U.S. PATENT DOCUMENTS 3,856,992 A 12/1974 Cooper
3,997,725 A 12/1976 Gerzon
4,086,433 A 4/1978 Gerzon
4,151,369 A 4/1979 Gerzon
4,414,430 A 11/1983 Gerzon (Continued)

FOREIGN PATENT DOCUMENTS

JP 11018199 1/1999

(Continued)

OTHER PUBLICATIONS

Moorer et al., "Towards a Rational Basis for Multichannel Music Recording", (2000), 20 pgs., unpublished.

(Continued)

*Primary Examiner*—Xu Mei
(74) *Attorney, Agent, or Firm*—Stolowitz Ford Cowger LLP

(57) ABSTRACT

Techniques of making a recording of or transmitting a sound field from either multiple monaural or directional sound signals that reproduce through multiple discrete loud speakers a sound field with spatial harmonics that substantially exactly match those of the original sound field. Monaural sound sources are positioned during mastering to use contributions of all speaker channels in order to preserve the spatial harmonics. If a particular arrangement of speakers is different than what is assumed during mastering, the speaker signals are rematrixed at the home, theater or other sound reproduction location so that the spatial harmonics of the sound field reproduced by the different speaker arrangement match those of the original sound field. An alternative includes recording or transmitting directional microphone signals, or their spatial harmonic components, and then matrixing these signals at the sound reproduction location in a manner that takes into account the specific speaker arrangement. The techniques are described for both a two dimensional sound field and the more general three dimensional case, the latter based upon using spherical harmonics.

39 Claims, 6 Drawing Sheets

U.S. PATENT DOCUMENTS

| | | | |
|---|---|---|---|
| 5,173,944 A | 12/1992 | Begault | |
| 5,208,860 A | 5/1993 | Lowe et al. | |
| 5,260,920 A | 11/1993 | Ide et al. | |
| 5,319,713 A | 6/1994 | Waller, Jr. et al. | |
| 5,555,306 A | 9/1996 | Gerzon | |
| 5,594,800 A | 1/1997 | Gerzon | |
| 5,666,425 A | 9/1997 | Sibbald et al. | |
| 5,682,433 A | 10/1997 | Pickard et al. | |
| 5,715,318 A | 2/1998 | Hill et al. | |
| 5,771,294 A | 6/1998 | Inoue et al. | |
| 6,072,878 A | 6/2000 | Moorer | |
| 6,178,245 B1 | 1/2001 | Starkey et al. | |
| 6,259,795 B1 * | 7/2001 | McGrath | 381/310 |
| 6,507,658 B1 | 1/2003 | Abel et al. | |
| 6,608,903 B1 | 8/2003 | Miyazaki et al. | |
| 6,683,959 B1 * | 1/2004 | Kuwano et al. | 381/17 |
| 6,904,152 B1 | 6/2005 | Moorer | |
| 6,952,697 B1 | 10/2005 | Rothschild | |
| 7,394,904 B2 * | 7/2008 | Bruno et al. | 381/61 |

FOREIGN PATENT DOCUMENTS

| | | |
|---|---|---|
| WO | WO 9215180 | 9/1992 |
| WO | WO 9318630 | 9/1993 |
| WO | WO 9325055 | 12/1993 |
| WO | WO 0019415 | 4/2000 |

OTHER PUBLICATIONS

Morse et al., selected relevant pages from Methods of Theoretical Physics, Part II, (1953), pp. 1252-1309 and 1325-1330, McGraw-Hill Book Company, Inc., New York.

Gerzon, "Psychoacoustic Decoders for Multispeaker Stereo and Surround Sound", AES-An Audio Engineering Society Preprint, Presented at the 93rd Convention (1992), pp. 1-25.

Gerzon, "Ambisonics in Multichannel Broadcasting and Video", J. Audio Eng. Soc., (1985), pp. 859-871, vol. 33, No. 11.

Gerzon, "Periphony: With-Height Sound Reproduction", J. Audio Eng. Soc., (1973), pp. 2-10, vol. 21, No. 1.

Gerzon, "What's Wrong with Quadraphonics", Studio Sound, (1974), pp. 50, 51 and 66.

Gerzon, "Dummy Head Recording", Studio Sound, (1975), pp. 42-44.

Felgett, "Ambisonics. Part one: general system description", Studio Sound, (1975), pp. 20-22.

Gerzon, "Ambisonics. Part two: Studio techniques", Studio Sound, (1975), pp. 24-26 and 28.

Gerzon, "Multi-system ambisonic decoder (1—Basic design philosophy)", Wireless World, (1977), pp. 43-47, vol. 83.

Gerzon, Multi-system ambisonic decoder (2—Main decoder circuits), Wireless World, (1977), pp. 69-73, vol. 83.

Gerzon, "NRDC surround-sound system", Wireless World, (1977), pp. 36- 39, vol. 83.

Gerzon, "Experimental Tetrahedral Recording", Studio Sound 13, (1971),pp. 472-475.

Gerzon, "Experimental Tetrahedral Recording—Part One", Studio Sound, (1971), pp. 396-398, vol. 13.

Gerzon, "Experimental Tetrahedral Recording—Part Three", Studio Sound, (1971), pp. 510-515, vol. 13.

Gerzon, "Surround-sound psychoacoustics", Wireless World, (1974), pp. 483-486, vol. 80.

Gerzon, "The Principles of Quadraphonic Recording—Part One—Are Four Channels Really Necessary", Studio Sound, (1970), pp. 338-384, vol. 12.

Gerzon, "The Principles of Quadraphonic Recording—Part Two—The Vertical Element", Studio Sound, (1970), pp. 338-342, vol. 12.

International Search Report corresponding to International Application No. PCT/US00/28851, dated Jun. 17, 2001.

James Moorer et al.; "Sonic Studio HD", Printout listing of technical papers; Jun. 29, 2000, 2 pages.

* cited by examiner

MULTI-CHANNEL SURROUND SOUND MASTERING AND REPRODUCTION TECHNIQUES THAT PRESERVE SPATIAL HARMONICS IN THREE DIMENSIONS

CROSS-REFERENCE TO RELATED APPLICATIONS

This application is a continuation application of application Ser. No. 09/552,378, filed Apr. 19, 2000, which is a continuation-in-part of application Ser. No. 08/936,636, filed Sep. 24, 1997, each of which is hereby incorporated herein by reference in their entirety.

BACKGROUND OF THE INVENTION

This invention relates generally to the art of electronic sound transmission, recording and reproduction, and, more specifically, to improvements in surround sound techniques.

Improvements in the quality and realism of sound reproduction have steadily been made during the past several decades. Stereo (two channel) recording and playback through spatially separated loud speakers significantly improved the realism of the reproduced sound, when compared to earlier monaural (one channel) sound reproduction. More recently, the audio signals have been encoded in the two channels in a manner to drive four or more loud speakers positioned to surround the listener. This surround sound has further added to the realism of the reproduced sound. Multichannel (three or more channel) recording is used for the sound tracks of most movies, which provides some spectacular audio effects in theaters that are suitably equipped with a sound system that includes loud speakers positioned around its walls to surround the audience. Standards are currently emerging for multiple channel audio recording on small optical CDS (Compact Disks) that are expected to become very popular for home use. A recent DVD (Digital Video Disk) standard provides for multiple channels of PCM (Pulse Code Modulation) audio on a CD that may or may not contain video.

Theoretically, the most accurate reproduction of an audio wavefront would be obtained by recording and playing back an acoustic hologram. However, tens of thousands, and even many millions, of separate channels would have to be recorded. A two dimensional array of speakers would have to be placed around the home or theater with a spacing no greater than one-half the wavelength of the highest frequency desired to be reproduced, somewhat less than one centimeter apart, in order to accurately reconstruct the original acoustic wavefront. A separate channel would have to be recorded for each of this very large number of speakers, involving use of a similar large number of microphones during the recording process. Such an accurate reconstruction of an audio wavefront is thus not at all practical for audio reproduction systems used in homes, theaters and the like.

When desired reproduction is three dimensional and the speakers are no longer coplanar, these complications correspondingly multiply and this sort of reproduction becomes even more impractical. The extension to three dimensions allows for special effects, such as for movies or in mastering musical recordings, as well as for when an original sound source is not restricted to a plane. Even in the case of, say, a recording of musicians on a planar stage, the resultant ambient sound environment will have a three dimensional character due to reflections and variations in instrument placement which can be captured and reproduced. Although more difficult to quantify than the localization of a sound source, the inclusion of the third dimension adds to this feeling of "spaciousness" and depth for the sound field even when the actual sources are localized in a coplanar arrangement.

Therefore, it is a primary and general object of the present invention to provide techniques of reproducing sound with improved realism by multi-channel recording, such as that provided in the emerging new audio standards, with about the same number of loud speakers as currently used in surround sound systems.

It is another object of the present invention to provide a method and/or system for playing back recorded or transmitted multi-channel sound in a home, theater, or other listening location, that allows the user to set an electronic matrix at the listening location for the specific arrangement of loud speakers being used there.

It is further objective of the present invention to extend these techniques and methods to the capture and reproduction of a three dimensional sound field where the loud speakers are placed in a non-coplanar arrangement.

SUMMARY OF THE INVENTION

These and additional objects are realized by the present invention, wherein, briefly and generally, an audio field is acquired and reproduced by multiple signals through four or more loud speakers positioned to surround a listening area, the signals being processed in a manner that reproduces substantially exactly a specified number of spatial harmonics of the acquired audio field with practically any specific arrangement of the speakers around the listening area. This adds to the realism of the sound reproduction without any particular constraint being imposed upon the positions of the loud speakers.

Rather than requiring that the speakers be arranged in some particular pattern before the system can reproduce the specified number of spatial harmonics, whatever speaker locations that exist are used as parameters in the electronic encoding and/or decoding of the multiple channel sound signals to bring about this favorable result in a particular reproduction layout. If one or more of the speakers is moved, these parameters are changed to preserve the spatial harmonics in the reproduced sound. Use of five channels and five speakers are described below to illustrate the various aspects of the present invention.

According to one specific aspect of the present invention, individual monaural sounds are mixed together by use of a matrix that, when making a recording or forming a sound transmission, angularly positions them, when reproduced through an assumed speaker arrangement around the listener, with improved realism. Rather than merely sending a given monaural sound to two channels that drive speakers on each side of the location of the sound, as is currently done with standard panning techniques, all of the channels are potentially involved in order to reproduce the sound with the desired spatial harmonics. An example application is in the mastering of a recording of several musicians playing together. The sound of each instrument is first recorded separately and then mixed in a manner to position the sound around the listening area upon reproduction. By using all the channels to maintain spatial harmonics, the reproduced sound field is closer to that which exists in the room where the musicians are playing.

According to another specific aspect of the present invention, the multi-channel sound may be rematrixed at the home, theater or other location where being reproduced, in order to accommodate a different arrangement of speakers than was assumed when originally mastered. The desired spatial harmonics are accurately reproduced with the different actual arrangement of speakers. This allows freedom of speaker placement, particularly important in the home which often imposes constraints on speaker placement, without losing the improved realism of the sound.

According to a further specific aspect of the present invention, a sound field is initially acquired with directional information by a use of multiple directional microphones. Either the microphone outputs, or spatial harmonic signals resulting from an initial partial matrixing of the microphone outputs, are recorded or transmitted to the listening location by separate channels. The transmitted signals are then matrixed in the home or other listening location in a manner that takes into account the actual speaker locations, in order to reproduce the recorded sound field with some number of spatial harmonics that are matched to those of the recording location.

These various aspects may use spatial harmonics in either two or three dimensions. In the two dimensional case, the audio wave front is reproduced by an arrangement of loud speakers that is largely coplanar, whether the initial recordings were based on two dimensional spatial harmonics or through projecting three dimensional harmonics on to the plane of the speakers. In a three dimensional reproduction, one or more of the speakers is placed at a different elevation than this two dimensional plane. Similarly, the three dimensional sound field is acquired by a non-coplanar arrangement of the multiple directional microphones.

Additional objects, features and advantages of the various aspects of the present invention will become apparent from the following description of its preferred embodiments, which embodiments should be taken in conjunction with the accompanying drawings.

DESCRIPTION OF THE PREFERRED EMBODIMENTS

The discussion starts with the method of spatial harmonics in a two dimensional plane. Some of the results of this methodology are: (1) a way of recording surround sound that can be used to feed any number of speakers; (2) a way of panning monaural sounds so as to produce exactly a given set of spatial harmonics; and (3) a way of storing or transmitting surround sound in three channels such that two of the channels are a standard stereo mix, and by use of the third channel, the surround feed may be recreated that preserves the original spatial harmonics.

Following the two dimensional discussion, this same theory is extended to three dimensions. In two dimensions, the spatial harmonics are based on the Fourier sine and cosine series of a single variable, the angle $\phi$. Unfortunately, the mathematics for the 3D version is not as clean and compact as for 2D. There is not any particularly good way to reduce the complexity and for this reason the 2D version is presented first.

Figure 9:
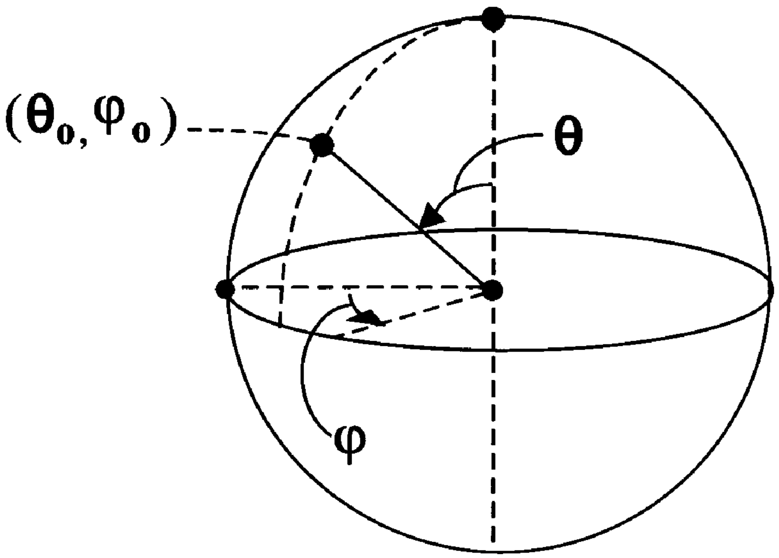
FIG. 9 illustrates the arrangement of the spherical coordinates.

To extend the method of spatial harmonics to 3 dimensions, a brief discussion of the Legendre functions and the spherical harmonics is then given. In some sense, this is a generalization of the Fourier sine and cosine series. The Fourier series is a function of one angle, $\phi$. The series is periodic. It can be thought of as a representation of functions on a circle. Spherical harmonics are defined on the surface of a sphere and are functions of two angles, $\theta$ and $\phi$. $\phi$ is the azimuth, defined where zero degrees is straight ahead, 90° is to the left, and 180° is directly behind. $\theta$ is the declination (up and down), with zero degrees directly overhead, 90° as the horizontal plane, and 180° being straight down. These are shown in FIG. 9 for a point $(\theta,\phi)$. Note that the range of $\theta$ is zero to 180°, whereas the range of $\phi$ is zero to 360° (or, alternately, −180° to 180°).

Spatial Harmonics in Two Dimensions

Figure 1:
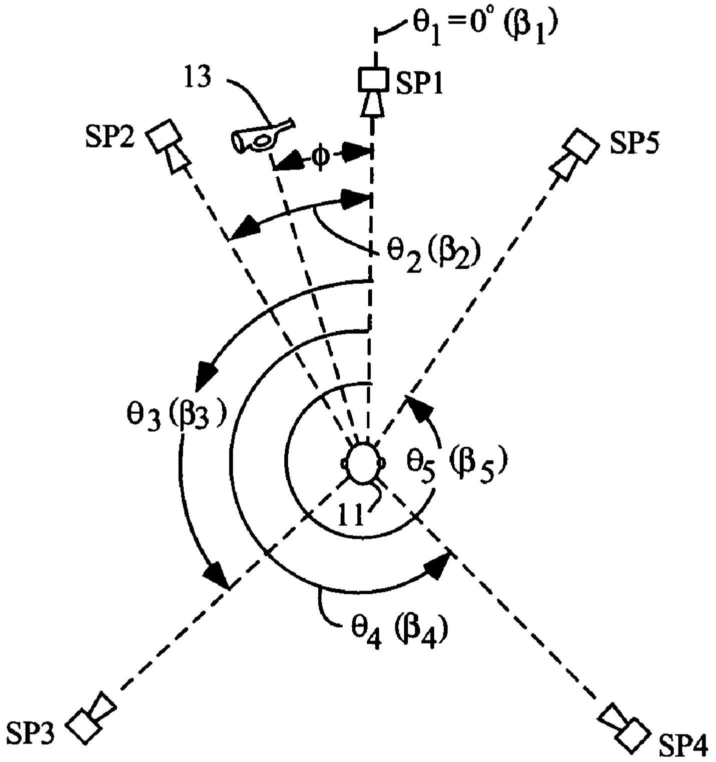
FIG. 1 is a plan view of the placement of multiple loud speakers surrounding a listening area.

A person 11 is shown in FIG. 1 to be at the middle of a listening area surrounded by loudspeakers SP1, SP2, SP3, SP4 and SP5 that are pointed to direct their sounds toward the center. A system of angular coordinates is established for the purpose of the descriptions in this application. The forward direction of the listener 11, facing a front speaker SP1, is taken to be positioned at $(\theta_1,\theta_1)=(90°,0°)$ as a reference. The angular positions of the remaining speakers SP2 (front left), SP3 (rear left), SP4 (rear right) and SP5 (front right) are respectively $(\theta_2,\phi_2)$, $(\theta_3,\phi_3)$, $(\theta_4,\phi_4)$, and $(\theta_5,\phi_5)$ from that reference. Here the speakers are positioned in a typical arrangement defining a surface that is substantially a plane, an example being the horizontal planar surface of $\theta=90°$ that is parallel to the floor of a room in which the speakers are positioned. In this situation, each of $\theta_1$-$\theta_5$ is then 90° and these $\theta$s will not be explicitly expressed for the time being and are omitted from FIG. 1. The elevation of one or more of the speakers above one or more of the other speakers is not required but may be done in order to accommodate a restricted space. The case of one or more of the $\theta_i \neq 90°$ is discussed below.

A monaural sound 13, such as one from a single musical instrument, is desired to be positioned at an angle $\phi_0$ from that zero reference, at a position where there is no speaker. There will usually be other monaural sounds that are desired to be simultaneously positioned at other angles but only the source 13 is shown here for simplicity of explanation. For a multi-instrument musical source, for example, the sounds of the individual instruments will be positioned at different angles $\phi_0$ around the listening area during the mastering process. The sound of each instrument is typically acquired by one or more microphones recorded monaurally on at least one separate channel. These monaural recordings serve as the sources of the sounds during the mastering process. Alternatively, the mastering may be performed in real time from the separate instrument microphones.

Figure 2:
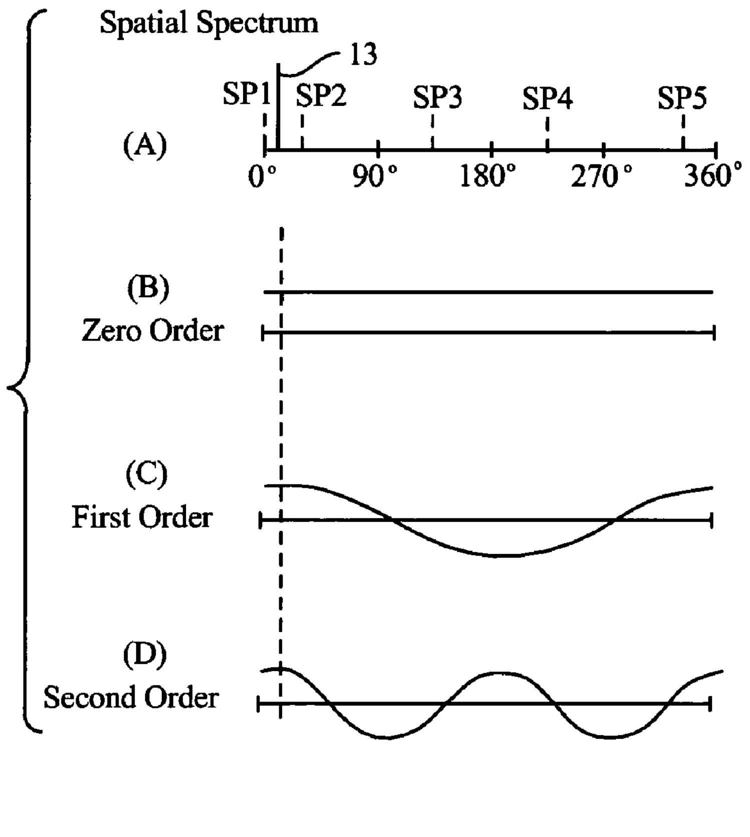
FIGS. 2A-D illustrate acoustic spatial frequencies of the sound reproduction arrangement of FIG. 1.

Before describing the mastering process, FIGS. 2A-D are referenced to illustrate the concept of spatial frequencies. FIG. 2A shows the space surrounding the listening area of FIG. 1 in terms of angular position. The five locations of each of the speakers SP1, SP2, SP3, SP4 and SP5 are shown, as is the desired location of the sound source 13. The sound 13 may be viewed as a spatial impulse which in turn may be expressed as a Fourier expansion, as follows:

$$f(\phi) = a_0 + \sum_{m=1}^{M} (a_m \cos m\phi + b_m \sin m\phi) \quad (1)$$

where m is an integer number of the individual spatial harmonics, from 0 to the number M of harmonics being reconstructed, $a_m$ is the coefficient of one component of each harmonic and $b_m$ is a coefficient of an orthogonal component of each harmonic. The value $a_0$ thus represents the value of the spatial function's zero order.

The spatial zero order is shown in FIG. 2B, having an equal magnitude around entire space that rises and falls with the magnitude of the spatial impulse sound source 13. FIG. 2C shows a first order spatial function, being a maximum at the angle of the impulse 13 while having one complete cycle around the space. A second order spatial function, as illustrated in FIG. 2D, has two complete cycles around the space. Mathematically, the spatial impulse 13 is accurately represented by a large number of orders but the fact of only a few speakers being used places a limit upon the number of spatial harmonics that may be included in the reproduced sound field. If the number of speakers is equal to or greater than (1+2n), where n here is the number of harmonics desired to be reproduced, then spatial harmonics zero through n of the reproduced sound field may be reproduced substantially exactly as exist in the original sound field. Conversely, the spatial harmonics which can be reproduced exactly are harmonics zero through n, where n is the highest whole integer that is equal to or less than one-half of one less than the number of speakers positioned around a listening area. Alternately, fewer than this maximum number of possible spatial harmonics may be chosen to be reproduced as in a particular system.

Figure 3:
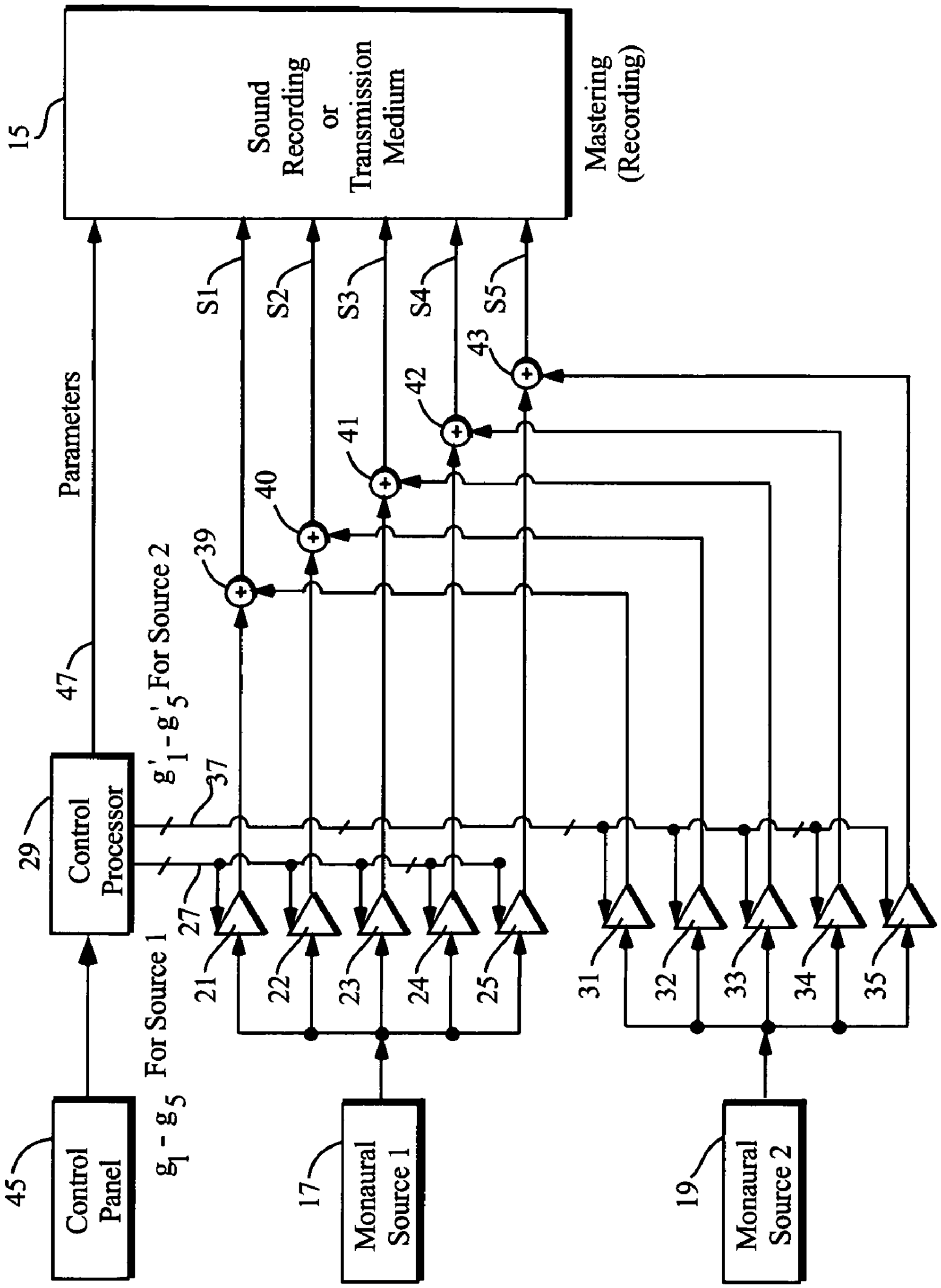
FIG. 3 is a block diagram of a matrixing system for placing the locations of monaural sounds.

One specific aspect of the present invention is illustrated by FIG. 3, which schematically shows certain functions of a sound console used to master multiple channel recordings. In this example, five signals S1, S2, S3, S4, and S5 are being recorded in five separate channels of a suitable recording medium such as tape, likely in digital form. Each of these signals is to drive an individual loud speaker. Two monaural sources 17 and 19 of sound are illustrated to be mixed into the recorded signals S1-S5. The sources 17 and 19 can be, for example, either live or recorded signals of different musical instruments that are being blended together. One or both of the sources 17 and 19 can also be synthetically generated or naturally recorded sound effects, voices and the like. In practice, there are usually far more than two such signals used to make a recording. The individual signals may be added to the recording tracks one at a time or mixed together for simultaneous recording.

What is illustrated by FIG. 3 is a technique of "positioning" the monaural sounds. That is, the apparent location of each of the sources 17 and 19 of sound when the recording is played back through a surround sound system, is set during the mastering process, as described above with respect to FIG. 1. Currently, usual panning techniques of mastering consoles direct a monaural sound into only two of the recorded signals S1-S5 that feed the speakers on either side of the location desired for the sound, with relative amplitudes that determines the apparent position to the listener of the source of the sound. But this lacks certain realism. Therefore, as shown in FIG. 3, each source of sound is fed into each of the five channels with relative gains being set to construct a set of signals that have a certain number of spatial harmonics, at least the zero and first harmonics, of a sound field emanating from that location. One or more of the channels may still receive no portion of a particular signal but now because it is a result of preserving a given number of spatial harmonics, not because the signal is being artificially limited to only two of the channels.

The relative contributions of the source 17 signal to the five separate channels S1-S5 is indicated by respective variable gain amplifiers 21, 22, 23, 24 and 25. Respective gains $g_1$, $g_2$, $g_3$, $g_4$, and $g_5$ of these amplifiers are set by control signals in circuits 27 from a control processor 29. Similarly, the sound signal of the source 19 is directed into each of the channels S1-S5 through respective amplifiers 31, 32, 33, 34 and 35. Respective gains $g_1'$, $g_2'$, $g_3'$, $g_4'$ and $g_5'$ of the amplifiers 31-35 are also set by the control processor 29 through circuits 37. These sets of gains are calculated by the control processor 29 from inputs from a sound engineer through a control panel 45. These inputs include angles Φ(FIG. 1) of the desired placement of the sounds from the sources 17 and 19 and an assumed set of speaker placement angles $\phi_1$-$\phi_5$. Calculated parameters may optionally also be provided through circuits 47 to be recorded. Respective individual outputs of the amplifiers 21-25 are combined with those of the amplifiers 31-35 by respective summing nodes 39, 40, 41, 42 and 43 to provide the five channel signals S1-S5. These signals S1-S5 are eventually reproduced through respective ones of the speakers SP1-SP5.

The control processor 29 includes a DSP (Digital Signal Processor) operating to solve simultaneous equations from the inputted information to calculate a set of relative gains for each of the monaural sound sources. A principle set of linear equations that are solved for the placement of each separately located sound source may be represented as follows:

$$1 + 2\sum_m \cos m(\phi_0 - \phi_i) = \sum_{j=1}^{N} g_i\left[1 + 2\sum_m \cos m(\phi_j - \phi_i)\right] \quad (2)$$

where $\phi_0$ represents the angle of the desired apparent position of the sound, $\phi_i$ and $\phi_j$ represent the angular positions that correspond to placement of the loudspeakers for the individual channels with each of i and j having values of integers from 1 to the number of channels, m represents spatial harmonics that extend from 0 the number of harmonics being matched upon reproduction with those of the original sound field, N is the total number of channels, and $g_i$ represents the relative gains of the individual channels with i extending from 1 to the number of channels. It is this set of relative gains for which the equations are solved. Use of the i and j subscripts follows the usual mathematical notation for a matrix, where i is a row number and j a column number of the terms of the matrix.

In a specific example of the number of channels N, and also the number of speakers, being equal to 5, and only the zero and first spatial harmonics are being reproduced exactly, the above linear equations may be expressed as the following matrix:

$$\begin{bmatrix} 1+2\cos(\phi_0-\phi_1) \\ 1+2\cos(\phi_0-\phi_2) \\ 1+2\cos(\phi_0-\phi_3) \\ 1+2\cos(\phi_0-\phi_4) \\ 1+2\cos(\phi_0-\phi_5) \end{bmatrix} = \begin{bmatrix} 1+2\cos(\phi_1-\phi_1) & 1+2\cos(\phi_2-\phi_1) & 1+2\cos(\phi_3-\phi_1) & 1+2\cos(\phi_4-\phi_1) & 1+2\cos(\phi_5-\phi_1) \\ 1+2\cos(\phi_1-\phi_2) & 1+2\cos(\phi_2-\phi_2) & 1+2\cos(\phi_3-\phi_2) & 1+2\cos(\phi_4-\phi_2) & 1+2\cos(\phi_5-\phi_2) \\ 1+2\cos(\phi_1-\phi_3) & 1+2\cos(\phi_2-\phi_3) & 1+2\cos(\phi_3-\phi_3) & 1+2\cos(\phi_4-\phi_3) & 1+2\cos(\phi_5-\phi_3) \\ 1+2\cos(\phi_1-\phi_4) & 1+2\cos(\phi_2-\phi_4) & 1+2\cos(\phi_3-\phi_4) & 1+2\cos(\phi_4-\phi_4) & 1+2\cos(\phi_5-\phi_4) \\ 1+2\cos(\phi_1-\phi_5) & 1+2\cos(\phi_2-\phi_5) & 1+2\cos(\phi_3-\phi_5) & 1+2\cos(\phi_4-\phi_5) & 1+2\cos(\phi_5-\phi_5) \end{bmatrix} \begin{bmatrix} g_1 \\ g_2 \\ g_3 \\ g_4 \\ g_5 \end{bmatrix} \quad (3)$$

This general matrix is solved for the desired set of relative gains $g_1$-$g_5$.

This is a rank 3 matrix, meaning that there are a large number of relative gain values that satisfy it. In order to provide a unique set of gains, another constraint is added. One such constraint is that the second spatial harmonic is zero, which causes the bottom two lines of the above matrix to be changed, as follows:

$$\begin{bmatrix} 1+2\cos(\phi_0-\phi_1) \\ 1+2\cos(\phi_0-\phi_2) \\ 1+2\cos(\phi_0-\phi_3) \\ 0 \\ 0 \end{bmatrix} = \begin{bmatrix} 1+2\cos(\phi_1-\phi_1) & 1+2\cos(\phi_2-\phi_1) & 1+2\cos(\phi_3-\phi_1) & 1+2\cos(\phi_4-\phi_1) & 1+2\cos(\phi_5-\phi_1) \\ 1+2\cos(\phi_1-\phi_2) & 1+2\cos(\phi_2-\phi_2) & 1+2\cos(\phi_3-\phi_2) & 1+2\cos(\phi_4-\phi_2) & 1+2\cos(\phi_5-\phi_2) \\ 1+2\cos(\phi_1-\phi_3) & 1+2\cos(\phi_2-\phi_3) & 1+2\cos(\phi_3-\phi_3) & 1+2\cos(\phi_4-\phi_3) & 1+2\cos(\phi_5-\phi_3) \\ \cos(2\phi_1) & \cos(2\phi_2) & \cos(2\phi_3) & \cos(2\phi_4) & \cos(2\phi_5) \\ \sin(2\phi_1) & \sin(2\phi_2) & \sin(2\phi_3) & \sin(2\phi_4) & \sin(2\phi_5) \end{bmatrix} \begin{bmatrix} g_1 \\ g_2 \\ g_3 \\ g_4 \\ g_5 \end{bmatrix} \quad (4)$$

An alternate constraint which may be imposed on the solution of the general matrix is to require that a velocity vector (for frequencies below a transition frequency within a range of about 750-1500 Hz.) and a power vector (for frequencies above this transition) be substantially aligned. As is well known, the human ear discerns the direction of sound with different mechanisms in the frequency ranges above and below this transition. Therefore, the apparent position of a sound that potentially extends into both frequency ranges is made to appear to the ear to be coming from the same place. This is obtained by equating the expressions for the angular direction of each of these vectors, as follows:

$$\arctan\frac{\sum g_i \sin\phi_i}{\sum g_i \cos\phi_i} \cong \arctan\frac{\sum g_i^2 \sin\phi_i}{\sum g_i^2 \cos\phi_i} \quad (5)$$

The definition of the velocity vector direction is on the left of the equal sign and that of the power vector on the right. For the power vector, taking the square of the gain terms is an approximation of a model of the way the human ear responds to the higher frequency range, so can vary somewhat between individuals.

Once a set of relative gains is calculated by the control processor 29 for each of the sounds to be positioned around the listener 11, the resulting signals S1-S5 can be played back from the recording 15 and individually drive one of the speakers SP1-SP5. If the speakers are located exactly in the angular positions $\phi_1$-$\phi_5$ around the listener 11 that were assumed when calculating the relative gains of each sound source, or very close to those positions, then the locations of all the sound sources will appear to the listener to be exactly where the sound engineer intended them to be located. The zero, first and any higher order spatial harmonics included in these calculations will be faithfully reproduced.

However, physical constraints of the home, theater or other location where the recording is to be played back often restrict where the speakers of its sound system may be placed. If angularly positioned around the listening area at angles different than those assumed during recording, the spatialization of the individual sound sources may not be optimal. Therefore, according to another aspect of the present invention, the signals S1-S5 are rematrixed by the listener's sound system in a manner illustrated in FIG. 4. The sound channels S1-S5 played back from the recording 15 are, in a specific implementation, initially converted to spatial harmonic signals $a_0$ (zero harmonic), $a_1$ and $b_1$ (first harmonic) by a harmonic matrix 51. The first harmonic signals $a_1$ and $b_1$ are orthogonal to each other.

If more than the zero and first spatial harmonics are to be preserved, two additional orthogonal signals for each further harmonic are generated by the matrix 51. These harmonic signals then serve as inputs to a speaker matrix 53 which converts them into a modified set of signals S1', S2', S3', S4' and S5' that are used to drive the uniquely position speakers in a way to provide the improved realism of the reproduced sound that was intended when the recording 15 was initially mastered with different speaker positions assumed. This is accomplished by relative gains being set in the matrices 51 and 53 through respective gain control circuits 55 and 57 from a control processor 59. The processor 59 calculates these gains from the mastering parameters that have been recorded and played back with the sound tracks, primarily the assumed speaker angles $\phi_1$, $\phi_2$, $\phi_3$, $\phi_4$ and $\phi_5$, and corresponding actual speaker angles $\beta_1$, $\beta_2$, $\beta_3$, $\beta_4$ and $\beta_5$, that are provided to the control processor by the listener through a control panel 61.

The algorithm of the harmonic matrix 51 is illustrated by use of 15 variable gain amplifiers arranged in five sets of three each. Three of the amplifiers are connected to receive each of the sound signals S1-S5 being played back from the recording. Amplifiers 63, 64 and 65 receive the S1 signal, amplifiers 67, 68 and 69 the S2 signal, and so on. An output from one amplifier of each of these five groups is connected with a summing node 81, having the $a_0$ output signal, an output from another amplifier of each of these five groups is connected with a summing node 83, having the $a_1$ output signal, and an output from the third amplifier of each group is connected to a third summing node 85, whose output is the $b_1$ signal.

The matrix 51 calculates the intermediate signals $a_o$, $a_1$ and $b_1$ from only the audio signals S1-S5 being played back from the recording 15 and the speaker angles $\phi_1$, $\phi_1$, $\phi_3$, $\phi_4$, and $\phi_5$, assumed during mastering, as follows:

$$a_0=S1+S2+S3+S4+S5$$

$$a_1=S1\cos\phi_1+S2\cos\phi_2+S3\cos\phi_3+S4\cos\phi_4+S5\cos\phi_5$$

$$b_1=S1\sin\phi_1+S2\sin\phi_2+S3\sin\phi_3+S4\sin\phi_4+S5\sin\phi_5 \quad (6)$$

Thus, in the representation of this algorithm shown as the matrix 51, the amplifiers 63, 67, 70, 73 and 76 have unity gain, the amplifiers 64, 68, 71, 74 and 77 have gains less than one that are cosine functions of the assumed speaker angles, and amplifiers 65, 69, 72, 75 and 78 have gains less than one that are sine functions of the assumed speaker angles.

The matrix 53 takes these signals and provides new signals S1', S2', S3', S4' and S5' to drive the speakers having unique positions surrounding a listening area. The representation of the processing shown in FIG. 4 includes 15 variable gain amplifiers 87-103 grouped with five amplifiers 87-91 receiving the signal $a_0$, five amplifiers 92-97 receiving the signal $a_1$, and five amplifiers 98-103 receiving the signal $b_1$. The output of a unique one of the amplifiers of each of these three groups provides an input to a summing node 105, the output of another of each of these groups provides an input to a summing node 107, and other amplifiers have their outputs connected to nodes 109, 111 and 113 in a similar manner, as shown.

The relative gains of the amplifiers 87-103 are set to satisfy the following set of simultaneous equations that depend upon the actual speaker angles β:

$$\sum_{j=1}^{N}[1+2\cos(\beta_j-\beta_i)]S_j'=a_0+a_1\cos\beta_i+b_1\sin\beta_i \quad (7)$$

where N=5 in this example, resulting in i and j having values of 1, 2, 3, 4 and 5. The result is the ability for the home, theater or other user to "dial in" the particular angles taken by the positions of the loud speakers, which can even be changed from time to time, to maintain the improved spatial performance that the mastering technique provides.

Figure 4:
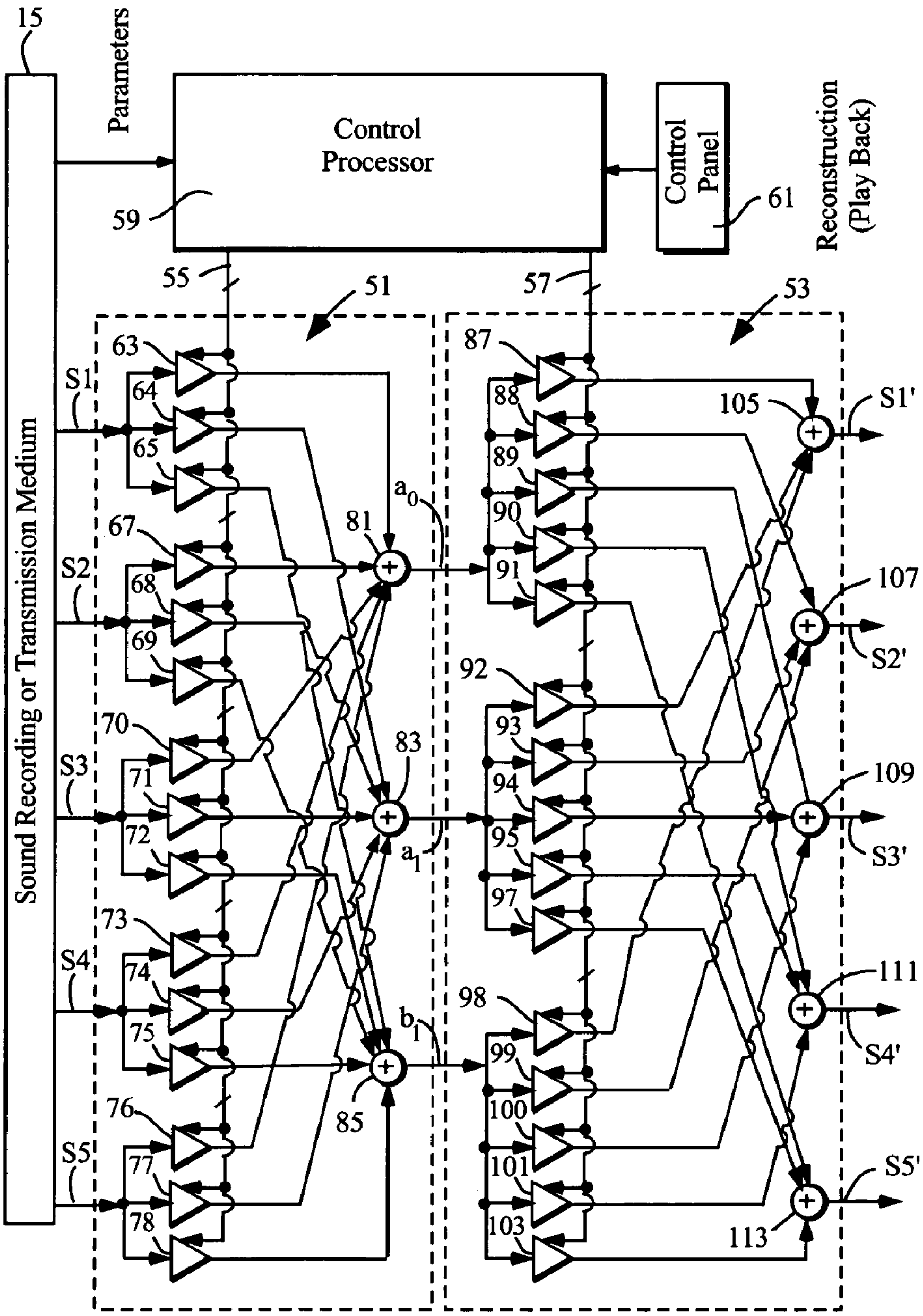
FIG. 4 is a block diagram for re-matrixed the signals matrixed in FIG. 3 in order to take into account a different position of the speakers than assumed when initially matrixing the signals.

A matrix expression of the above simultaneous equations for the actual speaker position angles β is as follows, where the condition of the second spatial harmonics equaling zero is also imposed:

The forgoing description has treated the mastering and reproducing processes as involving a recording, as indicated by block 15 in each of FIGS. 3 and 4. These processes may, however, also be used where there is a real time transmission of the mastered sound through the block 15 to one or more reproduction locations.

Figure 5:
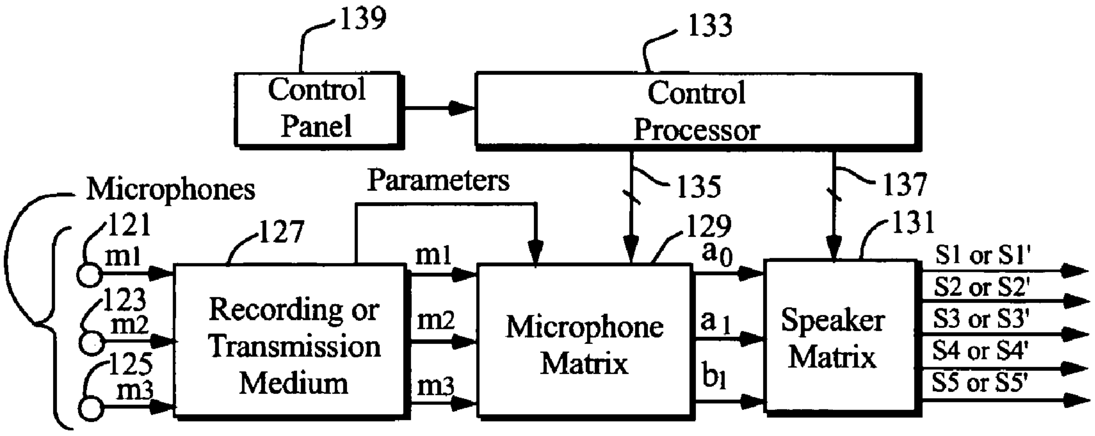
FIGS. 5 and 6 are block diagrams that show alternate arrangements for acquiring and reproducing sounds from multiple directional microphones.

The description with respect to FIGS. 3 and 4 has been directed primarily to mastering a three-dimensional sound field, or at least contribute to one, from individual monaural sound sources. Referring to FIG. 5, a technique is illustrated for mastering a recording or sound transmission from signals that represent a sound field in three dimensions. Three microphones 121, 123 and 125 are of a type and positioned with respect to the sound field to produce audio signals $m_1$, $m_2$ and $m_3$ that contain information of the sound field that allows it to be reproduced in a set of surround sound speakers. Positioning such microphones in a symphony hall, for example, produces signals from which the acoustic effect may be reconstructed with realistic directionality.

As indicated at 127, these three signals can immediately be recorded or distributed by transmission in three channels. The $m_1$, $m_2$ and $m_3$ signals are then played back, processed and reproduced in the home, theater and/or other location. The reproduction system includes a microphone matrix circuit 129 and a speaker matrix circuit 131 operated by a control processor 133 through respective circuits 135 and 137. This allows the microphone signals to be controlled and processed at the listening location in a way that optimizes, in order to accurately reproduce the original sound field with a specific unique arrangement of loud speakers around a listening area, the signals S1-S5 that are fed to the speakers. The matrix 129 develops the zero and first spatial harmonic signals $a_0$, $a_1$ and $b_1$ from the microphone signals $m_1$, $m_2$ and $m_3$. The speaker matrix 131 takes these signals and generates the individual speaker signals S1-S5 with the same algorithm as described for the matrix 53 of FIG. 4. A control panel 139 allows the user at the listening location to specify the exact speaker locations for use by the matrix 131, and any other parameters required.

Figure 6:
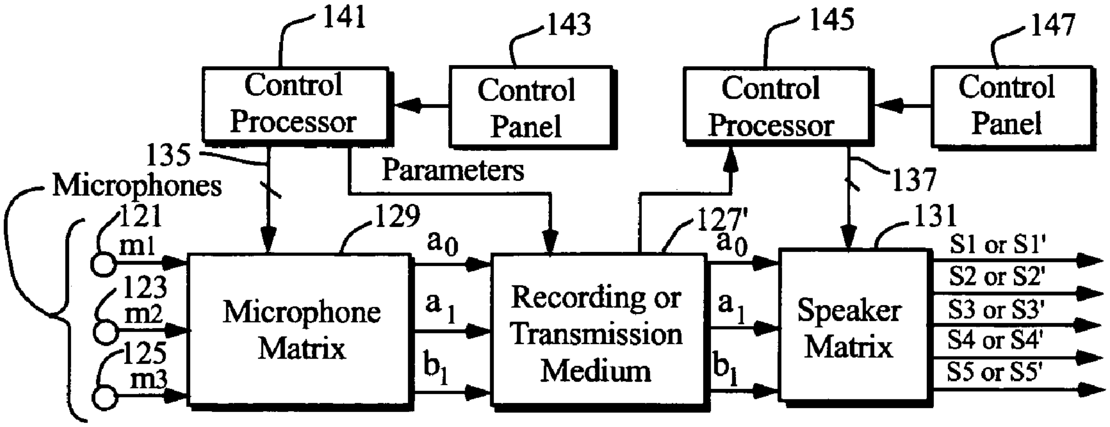

The arrangement of FIG. 6 is very similar to that of FIG. 5, except that it differs in the signals that are recorded or transmitted. Instead of recording or transmitting the microphone signals at 127 (FIG. 5), the microphone matrixing 129 is performed at the sound originating location (FIG. 6) and the $$\begin{vmatrix} 1+2\cos(\beta_1-\beta_1) & 1+2\cos(\beta_2-\beta_1) & 1+2\cos(\beta_3-\beta_1) & 1+2\cos(\beta_4-\beta_1) & 1+2\cos(\beta_5-\beta_1) \\ 1+2\cos(\beta_1-\beta_2) & 1+2\cos(\beta_2-\beta_2) & 1+2\cos(\beta_3-\beta_2) & 1+2\cos(\beta_4-\beta_2) & 1+2\cos(\beta_5-\beta_2) \\ 1+2\cos(\beta_1-\beta_3) & 1+2\cos(\beta_2-\beta_3) & 1+2\cos(\beta_3-\beta_3) & 1+2\cos(\beta_4-\beta_3) & 1+2\cos(\beta_5-\beta_3) \\ \cos(2\beta_1) & \cos(2\beta_2) & \cos(2\beta_3) & \cos(2\beta_4) & \cos(2\beta_5) \\ \sin(2\beta_1) & \sin(2\beta_2) & \sin(2\beta_3) & \sin(2\beta_4) & \sin(2\beta_5) \end{vmatrix} \begin{vmatrix} S1' \\ S2' \\ S3' \\ S4' \\ S5' \end{vmatrix} = \begin{vmatrix} a_0+a_1\cos\beta_1+b_1\sin\beta_1 \\ a_0+a_1\cos\beta_2+b_1\sin\beta_2 \\ a_0+a_1\cos\beta_3+b_1\sin\beta_3 \\ 0 \\ 0 \end{vmatrix} \quad (8)$$

The values of relative gains of the amplifiers 87-103 are chosen to implement the resulting coefficients of $a_0$, $a_1$ and $b_1$ that result from solving the above matrix for the output signals S1'-S5' of the circuit matrix 53 with a given set of actual speaker position angles $\beta_1$-$\beta_5$.

resulting spatial harmonics $a_0$, $a_1$ and $b_1$ of the sound field are recorded or transmitted at 127'. A control processor 141 and control panel 143 are used at the mastering location. A control processor 145 and control panel 147 are used at the listening location. An advantage of the system of FIG. 6 is that the recorded or transmitted signals are independent of the type and arrangement of microphones used, so information of this need not be known at the listening location.

Figure 7:
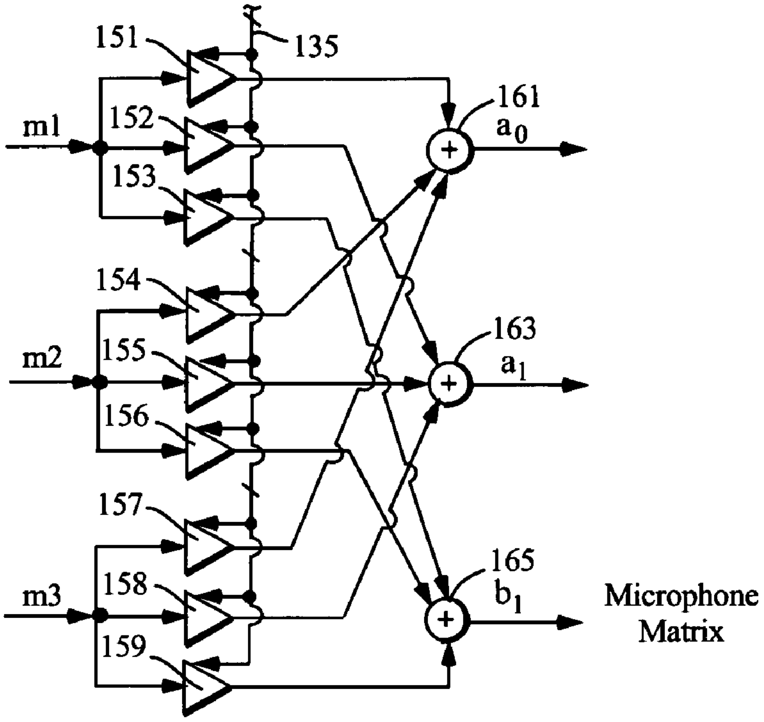
FIG. 7 provides more detail of the microphone matrix block in FIGS. 5 and 6.

An example of the microphone matrix 129 of FIGS. 5 and 6 is given in FIG. 7. Each of the three microphone signals $m_1$, $m_2$ and $m_3$ is an input to a bank of three variable gain amplifiers. The signal $m_1$ is applied to amplifiers 151-153, the signal $m_2$ to amplifiers 154-156, and the signal $m_3$ to amplifiers 157-159. One output of each bank of amplifiers is connected to a summing node that results in the zero spatial harmonic signal $a_0$. Also, another one of the amplifier outputs of each bank is connected to a summing node 163, resulting in the first spatial harmonic signal $a_1$. Further, outputs of the third amplifier of each bank are connected together in a summing node 165, providing first harmonic signal $b_1$.

Figure 8:
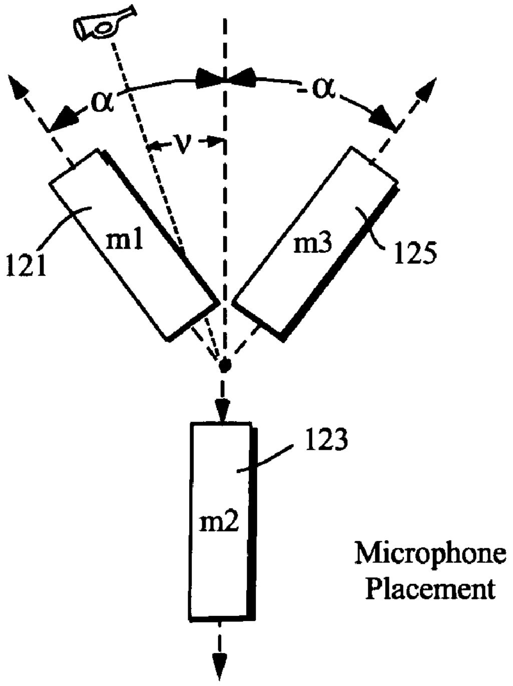
FIG. 8 shows an arrangement of three microphones as the source of the audio signals to the systems of FIGS. 5 and 6.

The gains of the amplifiers 151-159 are individually set by the control processor 133 or 141 (FIG. 5 or 6) through circuits 135. These gains define the transfer function of the microphone matrix 129. The transfer function that is necessary depends upon the type and arrangement of the microphones 121, 123 and 125 being used. FIG. 8 illustrates one specific arrangement of microphones. They can be identical but need not be. No more than one of the microphones can be omnidirectional. As a specific example, each is a pressure gradient type of microphone having a cardioid pattern. They are arranged in a Y-pattern with axes of their major sensitivities being directed outward in the directions of the arrows. The directions of the microphones 121 and 125 are positioned at an angle α on opposite sides of the directional axis of the other microphone 123.

In this specific example, the microphone signals can be expressed as follows, where ν is an angle of the sound source with respect to the directional axis of the microphone 123:

$$m_1=1+\cos(\nu-\alpha)$$

$$m_2=1-\cos\nu$$

$$m_3=1+\cos(\nu+\alpha) \quad (9)$$

The three spatial harmonic outputs of the matrix 129, in terms of its three microphone signal inputs, are then:

$$a_0=\frac{\frac{(m_1+m_3)}{2}+m_2\cos\alpha}{1+\cos\alpha} \quad (10)$$

$$a_1=\frac{\frac{(m_1+m_3)}{2}-m_2}{1+\cos\alpha}$$

$$b_1=\frac{m_1-m_3}{2\sin\alpha}$$

Since these are linear equations, the gains of the amplifiers 151-159 are the coefficients of each of the $m_1$, $m_2$ and $m_3$ terms of these equations.

The various sound processing algorithms have been described in terms of analog circuits for clarity of explanation. Although some or all of the matrices described can be implemented in this manner, it is more convenient to implement these algorithms in commercially available digital sound mastering consoles when encoding signals for recording or transmission, and in digital circuitry in playback equipment at the listening location. The matrices are then formed within the equipment in digital form in response to supplied software or firmware code that carries out the algorithms described above.

In both mastering and playback, the matrices are formed with parameters that include either expected or actual speaker locations. Few constraints are placed upon these speaker locations. Whatever they are, they are taken into account as parameters in the various algorithms. Improved realism is obtained without requiring specific speaker locations suggested by others to be necessary, such as use of diametrically opposed speaker pairs, speakers positioned at floor and ceiling corners of a rectangular room, other specific rectilinear arrangements, and the like. Rather, the processing of the present invention allows the speakers to first be placed where desired around a listening area, and those positions are then used as parameters in the signal processing to obtain signals that reproduce sound through those speakers with a specified number of spatial harmonics that are substantially exactly the same as those of the original audio wavefront.

The spatial harmonics being faithfully reproduced in the examples given above are the zero and first harmonics but higher harmonics may also be reproduced if there are enough speakers being used to do so. Further, the signal processing is the same for all frequencies being reproduced, a high quality system extending from a low of a few tens of Hertz to 20,000 Hz or more. Separate processing of the signals in two frequency bands is not required.

Three Dimensional Representation

So far the discussion has presented the method of spatial harmonics in two dimensions by considering both the load speakers and sound sources to lie in a plane. This same theory may be extended to 3 dimensions. It then requires 4 channels to transmit the $0^{th}$ and $1^{st}$ terms of the 3-dimensional spatial harmonic expansion. It has the same properties for matrixing, such that 2 channels may carry a standard stereo mix, and the other two channels may be used to create feeds for any number of speakers around the listener. Unfortunately, the mathematics for the 3D version is not as clean and compact as for 2D. There is not any particularly good way to reduce the complexity.

To extend the method of spatial harmonics to three dimensions, a brief discussion of the Legendre functions and the spherical harmonics is needed. In some sense, this is a generalization of the Fourier sine and cosine series. The Fourier series is a function of one angle, ϕ. The series is periodic and can be used to represent functions on a circle. Just as the Fourier sine and cosine series are a complete set of orthogonal functions on the circle, spherical harmonics are a complete set of orthogonal functions defined on the surface of a sphere. As such, any function upon the sphere can be represented by spherical harmonics in a generalized Fourier series.

The spherical harmonics are functions of two coordinates on the sphere, the angles θ and ϕ. These are shown in FIG. 9 where a point on the surface of the sphere is represented by the pair (θ,ϕ). ϕ is azimuth. Zero degrees is straight ahead. 90° is to the left. 180° is directly behind. θ is declination (up and down). Zero degrees is directly overhead. 90° is the horizontal plane, and 180° is straight down. Note that the range of θ is zero to 180°, whereas the range of ϕ is zero to 360° (or −180° to 180°). In the discussion in two dimensions, the angular variable θ has been suppressed and taken as equal to 90°. More generally, both angle are included. For example, the positions of speakers SP1, SP2, SP3, SP4 and SP5 in FIG. 1 are now given by the respective pairs of angles $(\theta_1,\phi_1)$, $(\theta_2,\phi_2)$, $(\theta_3,\phi_3)$, $(\theta_4,\phi_4)$, and $(\theta_5,\phi_5)$, where the $\theta_i$ now lie anywhere in the range of from 0° to 180°. FIGS. 1 and 8 can be considered either as a coplanar arrangement of the shown elements or a projection of the three dimensional situation onto a particular planar subspace.

The common definition of spherical harmonics starts with the Legendre polynomials, which are defined as follows:

$$P_n(\mu) \equiv \frac{1}{2^n n!}\frac{d^n}{d\mu^n}(\mu^2-1)^n \tag{11}$$

From these, we can define Legendre's associated functions, which are define as follows:

$$P_n^m(\mu) \equiv (-1)^m(1-\mu^2)^{\frac{m}{2}}\frac{d^m P_n(\mu)}{d\mu^m}, \tag{12}$$

where $P_0(\cos\theta)=1$, $P_1(\cos\theta)=\cos\theta$, $P_1^{\,1}(\cos\theta)=-\sin\theta$, and so on. Both the Legendre polynomials and the associated functions are orthogonal (but not orthonormal). These specific definitions are given since some authors define them slightly differently. If one of the alternate definitions is used, the equations below must be altered appropriately.

Although these are polynomials, they are turned into periodic functions with the following substitution:

$$\mu \equiv \cos\theta. \tag{13}$$

From these, an expansion of a function in polar coordinates can be made as follows:

$$f(\theta,\phi) = \sum_{n=0}\left\{A_n P_n(\cos\theta) + \sum_{m=1}^{n}(A_{nm}\cos m\phi + B_{nm}\sin m\phi)P_n^m(\cos\theta)\right\}. \tag{14}$$

The functions $P_n(\cos\theta)$, $\cos m\phi P_n^{\,m}(\cos\theta)$, and $\sin m\phi P_n^{\,m}(\cos\theta)$ are called spherical harmonics. This expansion has an equivalence to the Fourier series of equation (1), but it is relatively messy to actually derive it. One approach is to fix the value of θ at, say, 90°. The remaining terms collapse into something that is equivalent to the Fourier sine and cosine series. The coefficients ($A_n$, $A_{nm}$, $B_{nm}$) generalize the coefficients ($a_0$, $a_m$, $b_m$) in equation (1) for n≠0.

For a function that is just defined on the circle, there are 1+2T coefficients for a series that include harmonics of order 0 through T. For the spherical harmonic expansion, the total number of coefficients is $(T+1)^2$ if harmonics through order T are included, with the square arising as the sphere is a two dimensional surface. Thus, if keeping the harmonics through first order now requires the four terms of $A_0$, $A_1$, $A_{11}$, and $B_{11}$ instead of the three terms of $a_0$, $a_1$, and $b_1$.

When applied to sound, this can be though of as the sound pressure on the surface of a microscopic sphere at a point in space centered at the location of a listener. This expansion is used as a guide through the generation of pan matrices and microphone processing for sounds that may originate in any direction around the listener.

As in the 2D discussion, the function on the sphere that we want to approximate is taken to be a unit impulse in the direction ($\theta_0$, $\phi_0$) to the listener, the additional coordinate θ now made explicit. For compactness, define $\mu_0$ as follows:

$$\mu_0 \equiv \cos\theta_0. \tag{15}$$

The expansion of a unit impulse in that direction can be calculated to be the following:

$$f_0(\theta,\phi) = \sum_{n=0}\frac{2n+1}{2\pi}\left\{\frac{1}{2}P_n(\mu_0)P_n(\mu) + \sum_{m=1}^{n}\frac{(n-m)!}{(n+m)!}\cos m(\phi-\phi_0)P_n^m(\mu_0)P_n^m(\mu)\right\}. \tag{16}$$

For multiple point sources at a number of different positions ($\theta_0$,$\phi_0$) or for a non-point source, this function is respectively replaced by a sum over these points or an integral over the distribution.

Although the discussion here is given using the three dimensional harmonics that arise from spherical coordinates, other sets of orthogonal functions in three dimensions could similarly be employed. The corresponding orthogonal functions would then be used instead in equation (16) and the other equations. For example, if the geometry of the three dimensional speaker placement in the listening area suits itself to a particular coordinate system or if the microscopic surface about the point corresponding to the listener is modelled as non-spherical due to microphone placement or characteristics, one of the, say, spheroidal coordinate systems and its corresponding orthogonal expansion could be used.

Returning to FIG. 1, N speakers around the listener at angles of ($\theta_1$, $\phi_1$), ($\theta_2$, $\phi_2$), . . . , ($\theta_N$, $\phi_N$), but now the exemplary values of N=5 and each of the $\theta_i$=90° are no longer used. The gains to each of the speakers, $g_i$, are sought so that the resulting sound field around a point at the center corresponds to the desired sound field ($f_0(\theta,\phi)$ above) as well as possible. These gains may be obtained by requiring the integrated square difference between the resulting sound field and the desired sound field be as small as possible. The result of this optimization is the following matrix equation that generalizes equation (2) with the right and left hand sides switched:

$$BG=S, \tag{17}$$

where G is a column vector of the speaker gains:

$$G^T=[g_1 \ldots g_N]. \tag{18}$$

The components of the matrix B may be computed as follows:

$$b_{ij} = \sum_{n=0}\frac{2n+1}{2\pi}\left\{\frac{1}{2}P_n(\mu_i)P_n(\mu_j) + \sum_{m=1}^{n}(-1)^m\frac{(n-m)!}{(n+m)!}\cos m(\phi_i-\phi_j)P_n^m(\mu_i)P_n^m(\mu_j)\right\}, \tag{19}$$

and $$S = [b_{10} \ldots\ b_{N0}]^T. \tag{20}$$

Note that equation (19) is similar to the expansion in equation (16) for the unit impulse in a certain direction but for the term $(-1)^m$. Although the first summation is written without an upper limit, in practice it will be a finite summation. The rank of the matrix B depends on how many terms of the expansion are retained. If the $0^{th}$ and $1^{st}$ terms are retained, the rank of B will be 4. If one more term is taken, the rank will be 9. The rank of B also determines the minimum number of speakers required to match that many terms of the expansion.

Any number of speakers may be used, but the system of equations will be under-determined if the number of speakers is not the perfect square number $(T+1)^2$ corresponding to the $T^{th}$ order harmonics. There are various ways to solve the under-determined system. One way is to solve the system using the pseudo-inverse of the matrix B. This is equivalent to choosing the minimum-norm solution, and provides a perfectly acceptable solution. Another way is to augment the system with equations that force some number of higher harmonics to zero. This involves taking the minimum number of rows of B that preserves it rank, then adding rows of the following form:

$$[P_{n+1}(\mu_1) \ldots P_{n+1}(\mu_N)]=[0] \tag{21a}$$

or $$[\cos\phi_1 P^m_{n+1}(\mu_1) \ldots \cos\phi_N P^m_{n+1}(\mu_N)]=[0] \tag{21b}$$

or $$[\sin\phi_1 P^m_{n+1}(\mu_1) \ldots \sin\phi_N P^m_{n+1}(\mu_N)]=[0]. \tag{21c}$$

These equations are generalizations of the process used to reduce equation (3) to equation (4) above. It does not make much difference exactly which of these are taken. Each additional row will augment the rank of the matrix until full rank is reached.

Thus we have derived the matrix equation required to produce speaker gains for panning a single (monophonic) sound source into multiple speakers that will preserve exactly some number of spatial harmonics in 3 dimensions.

FIGS. 3 and 4 illustrated the mastering and reconstruction process for a coplanar example of two monaural sources mixed into five signals which are then converted into the spatial harmonics through first order and finally matrixed into a modified set of signals. As noted there, any of these specific choices could be taken differently, although the choices of five signals being recording and five modified signals resulting as the output are convenient as a common multichannel arrangement is the 5.1 format of movie and home cinema soundtracks. Alternative multichannel recording and reproduction methods, for example that described in the co-pending U.S. patent application Ser. No. 09/505,556, filed Feb. 17, 2000, by James A. Moorer, entitled "CD Playback Augmentation" which is hereby incorporated herein by this reference.

The arrangement of FIGS. 3 and 4 extends to incorporate three dimensional harmonics, the main changes being that now $(T+1)^2$ signals instead $(1+2T)$ signals are the output of harmonic matrix 51 if harmonics through T are retained. Thus, keeping the harmonics through first order now requires the four terms $(A_0, A_1, A_{11}, B_{11})$ instead of the three terms $(a_0, a_1, b_1)$. Additionally, control processor 59 must now calculate the gains form pairs of assumed speaker angles $(\theta_i,\phi_i)$ and corresponding a pairs actual speaker angles $(\gamma_j,\beta_j)$ instead the just the respective azimuthal angles $\phi_i$ and $\beta_j$, the $(\gamma_j,\beta_j)$ again being provided through a control panel 61. Finally, one convenient choice for the three dimensional, non-coplanar case is to use six signals S1-S6 and also a modified set of six signals S1'-S6'. In any case, to least four, non-coplanar speakers are required for the spherical harmonics just as at least three non-collinear speakers are required in the 2D case, since at least four non-coplanar points are needed to define a sphere and three non-collinear points define a circle in a plane.

The reason six speakers is a convenient choice is that it allows for four or five of the recorded or transmitted tracks on medium 15 to be mixed for a coplanar arrangement, with the remaining two or one tracks for speakers placed off the plane. This allows a listener without elevated speakers or without reproduction equipment for the spherical harmonics to access and use only the four or five coplanar tracks, while the remaining tracks are still available on the medium for the listener with full, three dimensional reproduction capabilities. This is similar to the situation described above in the 2D case where two channels can be used in a traditional stereo reproduction, but the additional channels are available for reproducing the sound field. In the 3D case of, say, six channels, two could be used for the stereo mix, augmented by two more for a four channel surround sound recording, with the last two available to further augment reproduction through six channels to provide the three dimensional sound field. The listener could then access the number of channels needed from the medium stored, for example, as described in the co-pending application "CD Playback Augmentation" included by reference above.

Returning to FIG. 3, the modifications in this example then consist of including an extra amplifier for each monaural source and an extra added to supply the additional signal S6 to the medium 15. The control panel 29 would also then supply an additional gain for each of the sources, with all of the gains now derived from the declination as well as the azimuthal location of the assumed speaker placements. Similarly in FIG. 4, each of the six signals S1-S6 would feed four amplifiers in matrix 51, one for each of the four summing nodes corresponding to $A_0$, $A_1$, $A_{11}$, and $B_{11}$ (or, more generally, four independent linear combinations of these) to produce theses four output in this example using the $0^{th}$ and $1^{st}$ order harmonics. Matrix 53 now has six amplifiers for each of these four harmonics to produce the set of six modified signals S1'-S6'. Again, the declination as well as the azimuthal location of the actual speaker placements is now used. More generally, control panel 61 could also supply control processor 59 with radial information on any speakers not on the same spherical surface as the other speakers. The control processor 59 could then use this information matrix 53 to produce corresponding modified signals to compensate for any differing radii by introducing delay, compensation for wave front spreading, or both.

In this arrangement, the equivalent of equation (6) above becomes:

$$A_0 = S1 + S2 + S3 + S4 + S5 + S6 \tag{6'}$$

$$A_1 = S1\cos\theta_1 + S2\cos\theta_2 + S3\cos\theta_3 + S4\cos_4 + S5\cos_5 + S6\cos\theta_6$$

$$A_{11} = S1\cos\phi_1\sin\theta_1 + S2\cos\phi_2\sin\theta_2 + S3\cos\phi_3\sin\theta_3 + S4\cos\phi_4\sin\theta_4 + S5\cos\phi_5\sin\phi_5 + S6\cos\phi_6\sin\theta_6$$

$$B_{11} = S1\sin\phi_1\sin\theta_1 + S2\sin\phi_2\sin\theta_2 + S3\sin\phi_3\sin\theta_3 + S4\sin\phi_4\sin\theta_4 + S5\sin\phi_5\sin\theta_5 + S6\sin\phi_6\sin\theta_6.$$

In the case discussed above where four of the speakers, say S1-S4, are taken to be in a typical, coplanar arrangement parallel to the floor of a room, $\theta_1$-$\theta_4$=90° and equation (6') simplifies considerably. Additionally, by having the full three dimensional representation, a two dimensional projection on to any other plane in the listening area can be realized by fixing the appropriate θs and φs.

A standard directional microphone has a pickup pattern that can be expressed as the $0^{th}$ and $1^{st}$ spatial spherical harmonics. The equation for the pattern of a standard pressure-gradient microphone is the following:

$$m(\theta,\phi)=C+(1-C)\{\cos\Theta\cos\theta+\sin\Theta\sin\theta\cos(\phi-\Phi)\}, \tag{22}$$

where Θ and Φ are the angles in spherical coordinates of the principal axis of the microphone. That is, they are the direction the microphone is "pointing." Equation (22) is the more general form of equations (9). Those equations correspond to, up to an overall factor of two, equation (22) with C=½, θ=Θ=90°, φ=ν, and Φ=α, 0, or −α for respective microphones $m_1$, $m_2$, or $m_3$. The constant C is called the "directionality" of the microphone and is determined by the type of microphone. C is one for an omni-directional microphone and is zero for a "figure-eight" microphone. Intermediate values yield standard pickup patterns such as cardioid (½), hypercardioid (¼), super-cardioid (⅜), and sub-cardioid (¾). With four microphones, we may recover the $0^{th}$ and $1^{st}$ spatial harmonics of the 3D sound field as follows:

$$\begin{vmatrix} A_0 \\ A_1 \\ A_{11} \\ B_{11} \end{vmatrix} = D \begin{vmatrix} m_1 \\ m_2 \\ m_3 \\ m_4 \end{vmatrix}. \tag{23}$$

This equation corresponds to the 2D $0^{th}$ and $1^{st}$ spatial harmonics of equation (10). The spatial harmonic coefficients on the left side of the equations are sometimes called W, Y, Z and X in commercial sound-field microphones. Representation of the 3-dimensional sound field by these four coefficients is sometimes referred to as "B-format." (The nomenclature is just to distinguish it from the direct microphone feeds, which are sometimes called "A-format").

The terms $m_1, \ldots, m_M$ refer to M pressure-gradient microphones with principal axes at the angles $(\Theta_1, \Phi_1), \ldots, (\Theta_M, \Phi_M)$ The matrix D may be defined by its inverse as follows:

$$D^{-1} = \begin{vmatrix} C_1 & (1-C_1)\cos\Theta_1 & (1-C_1)\sin\Theta_1\cos\Phi_1 & (1-C_1)\sin\Theta_1\sin\Phi_1 \\ C_2 & (1-C_2)\cos\Theta_2 & (1-C_2)\sin\Theta_2\cos\Phi_2 & (1-C_2)\sin\Theta_2\sin\Phi_2 \\ C_3 & (1-C_3)\cos\Theta_3 & (1-C_3)\sin\Theta_3\cos\Phi_3 & (1-C_3)\sin\Theta_3\sin\Phi_3 \\ C_4 & (1-C_4)\cos\Theta_4 & (1-C_4)\sin\Theta_4\cos\Phi_4 & (1-C_4)\sin\Theta_4\sin\Phi_4 \end{vmatrix}. \tag{24}$$

Each row of this matrix is just the directional pattern of one of the microphones. Four microphones unambiguously determine all the coefficients for the $0^{th}$ and $1^{st}$ order terms of the spherical harmonic expansion. The angles of the microphones should be distinct (there should not be two microphones pointing in the same direction) and non-coplanar (since that would provide information only in one angular dimension and not two). In these cases, the matrix is well-conditioned and has an inverse.

Corresponding changes will also be need in FIGS. 5, 6, and 7. In FIGS. 5 and 6, the number of microphones will now four, corresponding to $m_1$-$m_4$ in equation (23), and the four harmonics ($A_0$, $A_1$, $A_{11}$, $B_{11}$, or four independent linear combinations) replace the three terms ($a_0$, $a_1$, $b_1$). The number of output signals will also be adjusted: In the example used above, S6 or S6' now being included. Additionally, the alignment of each microphone is now specified by a pair of parameters, the angles (Θ, Φ) the principal axes, and each of the signals S1-S6 or S1'-S6' had a declination as well as an azimuthal angle. The microphone matrix of FIG. 7 will correspondingly now have four sets of four amplifiers.

Figure 10:
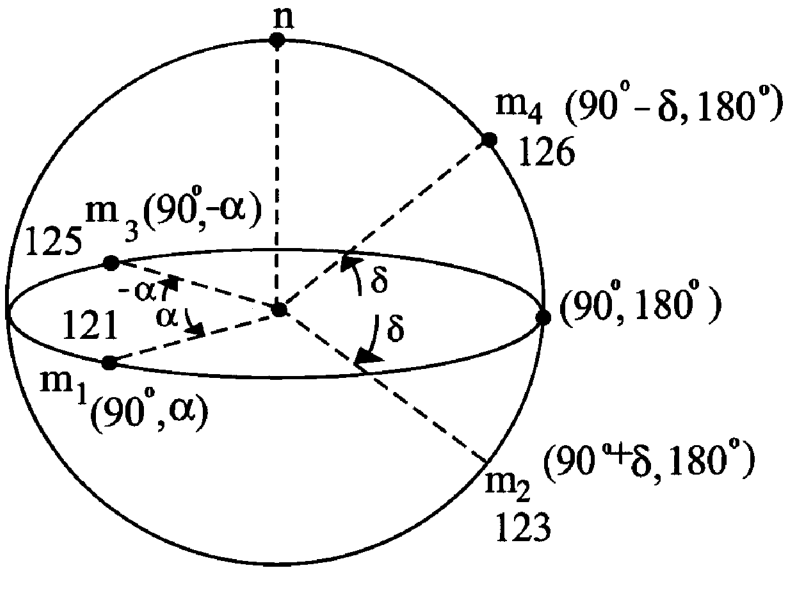
FIG. 10 shows an angular alignment for a three dimensional array of four microphones.

One possible arrangement of the four microphones of equations (23) and (24) is to place $m_1$-$m_3$ as FIG. 8 on the equatorial plane with $m_4$ at the north pole of the sphere. This corresponds to $(\Theta_1,\Phi_1),(\Theta_3,\Phi_3)=(90°,\pm\alpha)$, $(\Theta_2,\Phi_2)=(90°, 180°)$, $\Theta_4=0°$. Another alternative is to place the microphones with two rearward facing microphones as shown in FIG. 10, with $m_1$ 121 at (90°, α) $m_2$ 123 at (90°+δ,180°), $m_3$ 125 at (90°,−α), and $m_4$ 126 at (90°−δ, 180°). Taking α=δ=60° then produces a regular tetrahedral arrangement.

In some applications, one of the microphones may be placed at a different radius for practical reasons, in which case some delay or advance of the corresponding signal should be introduced. For example, if the rear-facing microphone $m_2$ of FIG. 8 were displaced a ways to the rear, the recording advanced about 1 ms for each foot of displacement to compensate for the difference in propagation time.

Equation (23) is valid for any set of four microphones, again assuming no more than one of them is omni-directional. By looking at this equation for two different sets of microphones, the directional pattern of the pickup can be changed by matrixing these four signals. The starting point is equations (23) and (24) for two different sets of microphones and their corresponding matrix D. The actual microphones and matrix will be indicated by the letters m and D, with the rematrixed, "virtual" quantities indicated by a tilde.

Given the formulation of equations (23) and (24), these microphone feeds may be transformed into the set of "virtual" microphone feeds as follows:

$$\begin{vmatrix} \tilde{m}_1 \\ \tilde{m}_2 \\ \tilde{m}_3 \\ \tilde{m}_4 \end{vmatrix} = \tilde{D}^{-1} \begin{vmatrix} A_0 \\ A_1 \\ A_{11} \\ B_{11} \end{vmatrix} = \tilde{D}^{-1} D \begin{vmatrix} m_1 \\ m_2 \\ m_3 \\ m_4 \end{vmatrix}. \tag{25}$$

The matrix $\tilde{D}$ represents the directionality and angles of the "virtual" microphones. The result of this will be the sound that would have been recorded if the virtual microphones had been present at the recording instead of the ones that were used. This allows recordings to be made using a "generic" sound-field microphone and then later matrix them into any set of microphones. For instance, we might pick just the first two virtual microphones, $\tilde{m}_1$, and $\tilde{m}_2$, and use them as a stereo pair for a standard CD recording $\tilde{m}_3$ could then be added in for the sort of planar surround sound recording described above, with $\tilde{m}_4$ used for the full three dimensional realization.

Any non-degenerate transformation of these four microphone feeds can be used to create any other set of microphone feeds, or can be used to generate speaker feeds for any number of speakers (greater than 4) that can recreate exactly the $0^{th}$ and $1^{st}$ spatial harmonics of the original sound field. In other words, the sound field microphone technique can be used to adjust the directional characteristics and angles of the microphones after the recording has been completed. Thus, by adding a third, rear-facing microphone in the 2D case and a fourth, non-coplanar microphone in the 3D case, the microphones can be revised through simple matrix operations. Whether the material is intended to be released in multi-channel format or not, the recording of the third, rear-facing channel allows increased freedom in a stereo release, with the recording of a fourth, non-coplanar channel increasing freedom in both stereo and planar surround-sound.

To matrix the microphone feeds into a number of speakers, we reformulate the right-hand side of the matrix equation (17) for panning as follows:

$$BG = R = R_1 D \begin{vmatrix} m_1 \\ m_2 \\ m_3 \\ m_4 \end{vmatrix}, \quad (26)$$

and $$R_1 = \begin{vmatrix} P_0(\mu_1) & P_1(\mu_1) & -\cos\phi_1 P_1^1(\mu_1) & -\sin\phi_1 P_1^1(\mu_1) \\ & \cdots & & \\ P_0(\mu_N) & P_1(\mu_N) & -\cos\phi_N P_1^1(\mu_N) & -\sin\phi_N P_1^1(\mu_N) \end{vmatrix}. \quad (27)$$

The matrix, $R_1$, is simply the $0^{th}$ and $1^{st}$ order spherical harmonics evaluated at the speaker positions. One must be careful to include the term $(-1)^m$, since that is a direct result of the least-squares optimization required to derive these equations.

Returning to the recording of the sound field, the three or four channels of (preferably uncompressed) audio material respectively corresponding to the 2D and 3D sound field may be stored on the disk or other medium, and then rematrixed to stereo or surround in a simple manner. By equation (25) (or its 2D reduction), there are an infinite number of non-degenerate transformations of four channels into four other channels in a lossless fashion. Thus, instead of storing spatial harmonics, two channels could store a suitable stereo mix, the third store a channel for a 2D surround mix, and use the fourth channel for the 3D surround mix. In addition to the audio, the matrix $\tilde{D}$ or its inverse is also stored on the medium. For a stereo presentation, the player simply ignores the third and fourth channels of audio and plays the other two as the left and right feeds. For a 2D surround presentation, the inverse of the matrix $\tilde{D}$ is used to derive the 0-th and first 2D spatial harmonics from the first three channels. From the spatial harmonics, a matrix such as equation (8) or the planar projection of equation (17) is formed and the speaker feeds calculated. For the 3D surround presentation, the 3D harmonics are derived from $\tilde{D}$ using all four channels to form the matrix of equation (17) and calculate the speaker feeds.

Although the various aspects of the present invention have been described with respect to their preferred embodiments, it will be understood that the present invention is entitled to protection within the full scope of the appended claims.

The invention claimed is:

1. A system for processing a sound field for reproduction of the sound field over a frequency range through a surround sound system having a plurality of channels individually feeding a corresponding plurality of speakers, comprising:

means for directing acquired sound field signals into individual ones of the plurality of channels with a set of relative gains for the frequency range;

where selected positions of the plurality of speakers around a listening area are not constrained to a pattern;

where individual ones of a plurality of three dimensional spatial harmonics of the sound field is substantially preserved; and where a sound field reproduced from the speakers arranged in the selected positions substantially reproduces the plurality of three dimensional spatial harmonics of the acquired sound field.

2. The system of claim 1 where the individual ones of the plurality of three dimensional spatial harmonics that are substantially preserved includes only zero and first order harmonics.

3. The system of claim 1 where the individual ones of the plurality of three dimensional spatial harmonics that are substantially preserved includes zero to nth harmonics, where n is an integer equal to or less than one less than the square root of a number of speakers.

4. The system of claim 1 where the means for directing is further configured to operate on multiple monaural signals of sounds desired to be located at specific positions around the listening area; and where the sound field reproduced from the plurality of speakers additionally includes the monaural sounds located at the specific positions.

5. The system of claim 1 where the means for directing is further configured to acquire multiple signals of the sound field from multiple directional microphones in the sound field.

6. The system of claim 1 where the means for directing is configured to determine the set of relative gains at least in part by a relationship that includes assumed positions of the speakers around some listening area.

7. The system of claim 1 where the means for directing is configured to determine the set of relative gains at least in part at a location adjacent the listening area by a relationship that includes actual positions of the speakers around the listening area.

8. The system of claim 1 where the means for directing is configured to determine the set of relative gains by that which causes a velocity and power vectors to be substantially aligned.

9. The system of claim 1 where the means for directing is configured to determine the set of relative gains by that which causes second or higher of said plurality of three dimensional spatial harmonics to be minimized.

10. A system for simulating a desired apparent three dimensional position of a sound in a multi-channel surround sound system, comprising:

means for monaurally acquiring the sound; and means for directing the acquired monaural sound into individual ones of the multiple channels with a set of relative gains that is determined by solving a relationship of a declination and an azimuth of a desired apparent position of the sound with respect to a point and a set of angular positions extending around the point that correspond to expected positions of speakers driven by the individual ones of the multiple channel signals;

where the relationship is solved in a manner that substantially preserves at least zero and first order three dimensional harmonics of the sound when reproduced through speakers at the expected positions as if the monaural sound was actually present at the apparent position.

11. The system of claim 10 where speakers are actually positioned with at least one of said speakers having an actual position different from that of the expected positions;

where the means for directing includes means for calculating a modified set of relative gains for driving the speakers by solving a second relationship including the actual positions of the speakers and in a manner that preserves the at least zero and first order three dimensional harmonics of the sound when reproduced through speakers at the actual positions as if the monaural sound was actually present at the apparent position.

12. The system of claim 10 where the means for directing is configured to determine the set of relative gains responsive to velocity and power vectors of a sound field reproduced through the speakers to be substantially aligned.

13. The system of claim 10 where the means for directing is configured to determine the set of relative gains responsive to second and higher three dimensional spatial harmonics of a sound field reproduced through the speakers to be minimized.

14. The system of claim 10 where the number of multiple channels includes four or more.

15. The system of claim 14 where at least one of the expected positions of speakers is non-coplanar with the other ones of the expected positions of speakers.

16. A system for reproducing a three dimensional sound field through four or more speakers positioned around a listening area, comprising:

means for acquiring a plurality of electrical signals representative of the sound field;

means for processing the plurality of electrical signals to generate signals of at least zero and first order three dimensional spatial harmonics of the sound field; and means for processing the three dimensional spatial harmonic signals to determine relative gains of signals fed to individual ones of the speakers by solving a relationship that includes terms of actual positions of the speakers and, when solved, substantially preserves at least the zero and first order three dimensional harmonics of the sound field reproduced through the speakers as respectively matching the zero and first order three dimensional harmonics of the acquired sound field.

17. The system of claim 16 including means for recording and playing back the plurality of electrical signals representative of the sound field.

18. The system of claim 16 including means for recording and playing back the signals of the sound field harmonics.

19. The system of claim 16 including means for reproducing the sound field through at least six speakers.

20. The system of claim 19 where at least one of the at least six speakers is non-coplanar with another of the at least six speakers.

21. A system for processing a sound field, comprising:

a processor configured to direct acquired sound field signals into individual ones of a plurality of channels individually feeding a corresponding plurality of speakers with a set of relative gains for the frequency range;

where individual ones of a plurality of three dimensional spatial harmonics of the sound field is substantially preserved; and where a sound field reproduced from the speakers arranged in positions around a listening area substantially reproduces the plurality of three dimensional spatial harmonics of the acquired sound field.

22. The system of claim 21 where the individual ones of the plurality of three dimensional spatial harmonics that are substantially preserved includes zero and first order harmonics without substantial additional harmonics.

23. The system claim 21 where the individual ones of the plurality of three dimensional spatial harmonics that are substantially preserved includes zero to nth harmonics, where n is an integer equal to or less than one less than the square root of a number of speakers.

24. The system of claim 21 where the recording medium is further configured to store multiple monaural signals of sounds desired to be located at specific positions around the listening area; and where the processor is further configured to reproduce the monaural sounds located at the specific positions.

25. The system of claim 21 where the recording medium is further configured to store multiple signals from multiple directional microphones positioned in the sound field.

26. The system of claim 21 where the processor is further configured to determine the set of relative gains at least in part by a relationship that includes assumed positions of the speakers around some listening area.

27. The system of claim 21 where the processor is further configured to determine the set of relative gains at least in part at a location adjacent the listening area by a relationship that includes actual positions of the speakers around the listening area.

28. The system of claim 21 where the processor is further configured to determine the set of relative gains by that which causes a velocity and power vectors to be substantially aligned.

29. The system of claim 21 where the processor is further configured to determine the set of relative gains by that which causes second or higher of said plurality of three dimensional spatial harmonies to be minimized.

30. A system for simulating a desired apparent three dimensional position of a sound in a multi-channel surround sound system, comprising:

a recording medium configured to store monaurally acquired sound; and a processor configured to:

direct the stored monaurally acquired sound into individual ones of the multiple channels with a set of relative gains that is determined by solving a relationship of a declination and an azimuth of the desired apparent position of the sound with respect to a point and a set of angular positions extending around said point that correspond to expected positions of speakers driven by individual ones of the multiple channel signals; and solve for the relationship to substantially preserves at least zero and first order three dimensional harmonics of the sound when reproduced through speakers at the expected positions as if the monaural sound was actually present at said apparent position.

31. The system of claim 30 where at least one of said speakers includes an actual position different from that of the expected positions;

where the processor is further configured to calculate a modified set of relative gains for driving the speakers by solving a second relationship including the actual positions of the speakers and in a manner that preserves the at least zero and first order three dimensional harmonics of the sound when reproduced through speakers at the actual positions as if the monaural sound was actually present at the apparent position.

32. The system of claim 30 where the processor is further configured to determine the set of relative gains responsive to velocity and power vectors of a sound field reproduced through the speakers to be substantially aligned.

33. The system of claim 30 where the processor is further configured to determine the set of relative gains responsive to second and higher three dimensional spatial harmonics of a sound field reproduced through the speakers to be minimized.

34. The system of claim 31 where at least one of the expected positions of the speakers is in a different geometric plane than the other ones of the expected positions of the speakers.

35. A system for reproducing a three dimensional sound field through four or more speakers positioned around a listening area, comprising:

a recording medium configured to store a plurality of electrical signals representative of the sound field; and a processor configured to:

process the plurality of electrical signals to generate signals of at least zero and first order three dimensional spatial harmonics of the sound field; and process the three dimensional spatial harmonic signals to determine relative gains of signals fed to individual ones of the speakers by solving a relationship that includes terms of actual positions of the speakers and, when solved, substantially preserves at least the zero and first order three dimensional harmonics of the sound field reproduced through the speakers as respectively matching the zero and first order three dimensional harmonics of the sound field.

36. The system of claim 35 where the processor is further configured to play back the plurality of electrical signals representative of the sound field.

37. The system claim 35 where the processor is further configured to play back the signals of the sound field harmonics.

38. The system of claim 35 where the processor is further configured to cause reproduction of the sound field through at least six speakers.

39. The system of claim 35 where at least one of the at least six speakers is in a different geometric plane with another of the at least six speakers.

* * * * *

UNITED STATES PATENT AND TRADEMARK OFFICE

CERTIFICATE OF CORRECTION

PATENT NO. : 7,606,373 B2
APPLICATION NO. : 11/069533
DATED : October 20, 2009
INVENTOR(S) : James A. Moorer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1258 days.

Signed and Sealed this

Twelfth Day of October, 2010

David J. Kappos

*Director of the United States Patent and Trademark Office*

UNITED STATES PATENT AND TRADEMARK OFFICE

CERTIFICATE OF CORRECTION

PATENT NO. : 7,606,373 B2
APPLICATION NO. : 11/069533
DATED : October 20, 2009
INVENTOR(S) : James A. Moorer It is certified that error appears in the above-identified patent and that said Letters Patent is hereby corrected as shown below:

| | |
|---|---|
| Column 19, line 65 (Claim 2): | Delete “are” and replace with --is--; |
| Column 20, line 4 (Claim 3): | Delete “one” and replace with --one,--; |
| Column 21, line 8 (Claim 15): | Delete “14” and replace with --10--; |
| Column 21, line 53 (Claim 22): | Delete “are” and replace with --is--; |
| Column 21, line 56 (Claim 23): | After “system” insert --of--; |
| Column 21, line 58 (Claim 23): | Delete “one” and replace with --one,--; |
| Column 22, line 20 (Claim 29): | Delete “harmonies” and replace with --harmonics--; |
| Column 24, line 4 (Claim 37): | After “system” insert --of--. |

Signed and Sealed this

Sixteenth Day of November, 2010

David J. Kappos
*Director of the United States Patent and Trademark Office*